(12) United States Patent  
Endler

(10) Patent No.: US 7,767,320 B2  
(45) Date of Patent: Aug. 3, 2010

(54) HARD-MATERIAL-COATED BODIES AND METHOD FOR THEIR PRODUCTION

(75) Inventor: Ingolf Endler, Coswig (DE)

(73) Assignee: Fraunhofer-Gesellschaft zur Förderung der Angewandten Forschung E.V., München (DE)

( * ) Notice: Subject to any disclaimer, the term of this patent is extended or adjusted under 35 U.S.C. 154(b) by 200 days.

(21) Appl. No.: 11/922,865

(22) PCT Filed: Jul. 4, 2006

(86) PCT No.: PCT/EP2006/063881

§ 371 (c)(1),
(2), (4) Date: Dec. 26, 2007

(87) PCT Pub. No.: WO2007/003648

PCT Pub. Date: Jan. 11, 2007

(65) Prior Publication Data

US 2009/0123779 A1 May 14, 2009

(30) Foreign Application Priority Data

Jul. 4, 2005 (DE) .......... 10 2005 032 860

(51) Int. Cl.
*B32B 9/00* (2006.01)
*C23C 16/34* (2006.01)

(52) U.S. Cl. ............ 428/697; 428/698; 428/699; 427/255.23; 427/255.28; 427/255.394

(58) Field of Classification Search ........ 427/446, 427/255.23, 255.28, 255.39, 255.371, 255.394; 428/697, 698, 699

See application file for complete search history.

(56) References Cited

U.S. PATENT DOCUMENTS 5,330,853 A 7/1994 Hofmann et al.
(Continued)

FOREIGN PATENT DOCUMENTS

DE 41 15 616 9/1992
(Continued)

OTHER PUBLICATIONS

International Search Report.
(Continued)

*Primary Examiner*—Archene Turner
(74) *Attorney, Agent, or Firm*—Collard & Roe, P.C.

(57) ABSTRACT

The invention relates to hard-coated bodies with a single- or multi-layer system containing at least one $Ti_{1-x}Al_xN$ hard layer and a method for production thereof. The aim of the invention is to achieve a significantly improved wear resistance and oxidation resistance for such hard-coated bodies. Said hard-coated bodies are characterised in that the bodies are coated with at least one $Ti_{1-x}Al_xN$ hard layer, generated by CVD without plasma stimulation present as a single-phase layer with cubic NaCl structure with a stoichiometric coefficient x>0.75 to x=0.93 and a lattice constant $a_{fcc}$ between 0.412 nm and 0.405 nm, or as a multi-phase layer, the main phase being $Ti_{1-x}Al_xN$ with a cubic NaCl structure with a stoichiometric coefficient x>0.75 to x=0.93 and a lattice constant $a_{fcc}$ between 0.412 nm and 0.405 nm, with $Ti_{1-x}Al_xN$ with a wurtzite structure and/or as $TiN_x$ with NaCl structure as further phase. Another feature of said hard layer is that the chlorine content is in the range of only 0.05 to 0.9 atom %. The invention further relates to a method for production of the body, characterised in that the body is coated in a reactor at temperatures from 700° C. to 900° C. by means of CVD without plasma stimulation with titanium halides, aluminium halides and reactive nitrogen compounds as precursors, mixed at elevated temperatures. Said coating can be applied to tools made from steel, hard metals, cermets and ceramics, such as drills, millers and indexable inserts.

10 Claims, 1 Drawing Sheet

U.S. PATENT DOCUMENTS

Figure 1:
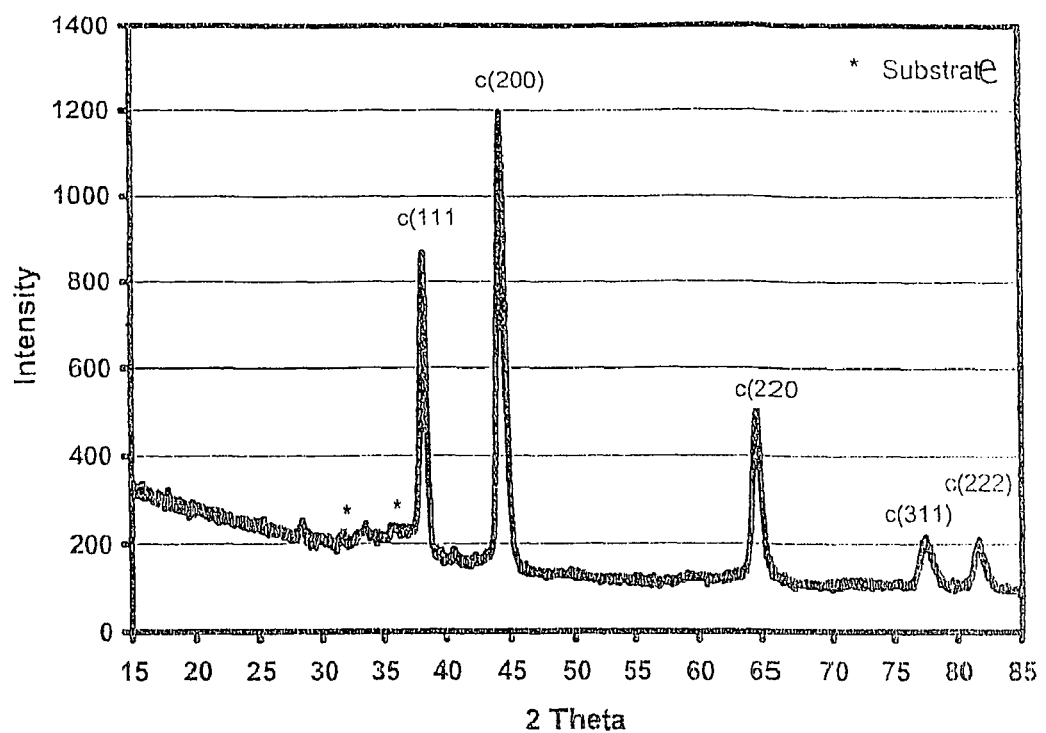

| | | | |
|---|---|---|---|
| 5,679,448 | A | 10/1997 | Kawata |
| 6,238,739 | B1 | 5/2001 | Madar et al. |
| 6,250,855 | B1 * | 6/2001 | Persson et al. ............... 51/309 |
| 6,326,093 | B1 * | 12/2001 | Lindholm et al. ........... 428/699 |
| 6,342,291 | B1 * | 1/2002 | Jonsson et al. .............. 428/697 |
| 7,094,479 | B2 * | 8/2006 | Sato et al. ................... 428/698 |

FOREIGN PATENT DOCUMENTS

| | | |
|---|---|---|
| DE | 44 08 250 | 1/1995 |
| WO | WO 03/085152 | 10/2003 |

OTHER PUBLICATIONS

Lee et al, "($Ti_{1-x}Al_x$)N Coatings by Plasma-enhanced Chemical Vapor Deposition", Journal of Vacuum Science and Technology, 1994, vol. 12, No. 4, p. 1602-1607, (ISR).

Wahlström et al, "Crystal growth and microstructure of polycrystalline $Ti_{1-x}Al_xN$ alloy films deposited by ultra-high-vacuum dual-target magnetron sputtering", Thin Solid Films, 1993, vol. 235, p. 62-70, (ISR).

Hörling et al, "Thermal stability of arc evaporated high aluminum-content $Ti_{1-x}Al_xN$ thin films", Journal of Vacuum Science and Technology, 2002, vol. 20, No. 5, p. 1815-1823, (ISR) (Spec, p. 3).

Cremer et al, "Determination of the cubic to hexagonal structure transition in the metastable system TiN—AlN", Springer-Verlag 1998, Fresenius J Anal Chem, vol. 361, 1998, p. 642-645, (Spec, p. 1).

Kawate et al, "Oxidation resistance $Cr_{1-x}Al_xN$ and $Ti_{1-x}Al_xN$ films", Surface and Coatings Technology, 2003, vol. 165, p. 163-167, (Spec, p. 2).

Kutschej et al, "Multi-functional Multi-component $Ti_{1-x}Al_xN$ Based Coatings", Proceedings 16$^{th}$ International Plansee Seminar, 2005, vol. 2, p. 774-788, (Spec, p. 2).

Prange, "Fortschritt-Berichte VDI", Abscheidung metastabiler $Ti_{1-x}Al_xN$-Schichten nach dem plasmagestützten CVD-Verfahren. Progress Reports of the Association of German Engineers, 2000, Series 5, No. 576, p. 28-39, (Spec, p. 2).

Kyrylov et al, "Correlation between plasma conditions and properties of (Ti,Al)N coatings deposited by PECVD", Surface and Coatings Technology, 2002, vol. 151-152, p. 359-364, (Spec, p. 2).

Heim et al, "TiAlN and TiAlCN deposition in an industrial PaCVD-plant", Surface and Coatings Technology, 1998, vol. 98, p. 1553-1556, (Spec, p. 3).

Anderbouhr et al, "LPCVD and PACVD (Ti,Al) N films: morphology and mechanical properties", Surface and Coatings Technology, 1999, vol. 115, p. 103-110, (Spec, p. 4).

* cited by examiner

HARD-MATERIAL-COATED BODIES AND METHOD FOR THEIR PRODUCTION

TECHNICAL FIELD

The invention relates to hard-material-coated bodies having a single-layer or multi-layer layer system that contains at least one $Ti_{1-x}Al_xN$ hard material layer, and a method for their production. The coating according to the invention can be used, in particular, for tools made of steel, hard metals, cermets, and ceramics, such as drills, milling cutters, and cutting inserts. The bodies coated according to the invention have improved friction-wear resistance and oxidation resistance.

STATE OF THE ART

The production of friction-wear protection layers in certain regions of the material system Ti—Al—N is already known, in accordance with WO 03/085152 A2. In this connection, it is possible to produce monophase TiAlN layers having the NaCl structure, at AlN contents up to 67%. These layers, which are produced by means of PVD, have lattice constants $a_{fcc}$ between 0.412 nm and 0.424 nm (R. Cremer, M. Witthaut, A. von Richthofen, D. Neuschütz, Fresenius J. Anal. Chem. 361 (1998) 642-645). Such cubic TiAlN layers possess a relatively great hardness and friction-wear resistance. In the case of AlN contents >67%, however, a mixture of cubic and hexagonal TiAlN is formed, and at an AlN proportion >75%, only the softer wurtzite structure, which is not resistant to friction wear, is formed.

It is also known that the oxidation resistance of cubic TiAlN layers increases with an increasing AlN content (M. Kawate, A. Kimura, T. Suzuki, Surface and Coatings Technology 165 (2003) 163-167). However, the scientific literature concerning TiAlN production by means of PVD indicates the view that practically no monophase cubic TiAlN layers having a high proportion of AlN can be formed any more above 750° C., i.e. that in the case of $Ti_{1-x}Al_xN$ phases where x>0.75, the hexagonal wurtzite structure will always be present (K. Kutschej, P. H. Mayrhofer, M. Kathrein, C. Michotte, P. Polcik, C. Mitterer, Proc. 16$^{th}$ Int. Plansee Seminar, May 30-Jun. 3, 2005, Reutte, Austria, Vol. 2, p. 774-788).

It was also already found that monophase $Ti_{1-x}Al_xN$ hard material layers with x up to 0.9 can be produced by means of plasma CVD (R. Prange, Diss. RTHW Aachen, 1999, Fortschritt-Berichte VDI [Progress Reports of the Association of German Engineers], 2000, Series 5, No. 576, as well as O. Kyrylov et al., Surface and Coating Techn. 151-152 (2002) 359-364). However, a disadvantage in this connection is the insufficient homogeneity of the layer composition, and the relatively high chlorine content in the layer. Furthermore, conducting the process is complicated and requires a lot of effort.

For the production of the known $Ti_{1-x}Al_xN$ hard material layers, PVD methods or plasma CVD methods are used, according to the state of the art, which methods are operated at temperatures below 700° C. (A. Hörling, L. Hultman, M. Oden, J. Sjölen, L. Karlsson, J. Vac. Sci. Technol. A 20 (2002) 5, 1815-1823, as well as D. Heim, R. Hochreiter, Surface and Coatings Technology 98 (1998) 1553-1556). It is a disadvantage of these methods that coating complicated component geometries presents difficulties. PVD is a very targeted process, and plasma CVD requires a high level of plasma homogeneity, since the plasma power density has a direct influence on the Ti/Al atom ratio of the layer. With the PVD methods which are almost exclusively used industrially, it is not possible to produce monophase cubic $Ti_{1-x}Al_xN$ layers with x>0.75.

Since cubic TiAlN layers are a metastable structure, production with conventional CVD methods, at high temperatures ≧1000° C. is fundamentally not possible, because a mixture of TiN and hexagonal AlN is formed at temperatures above 1000° C.

In accordance with U.S. Pat. No. 6,238,739 B1, it is also known that $Ti_{1-x}Al_xN$ layers with x between 0.1 and 0.6 can be obtained in the temperature range between 550° C. and 650° C., by means of a thermal CVD process, without plasma support, if a gas mixture of aluminum chlorides and titanium chlorides, as well as $NH_3$ and $H_2$, is used. The disadvantage of this special thermal CVD method also consists in the restriction to a layer stoichiometry x≦0.6 and the restriction to temperatures below 650° C. The low coating temperature leads to high chlorine contents in the layer, up to 12 at.-%, which are harmful for use (S. Anderbouhr, V. Ghetta, E. Blanquet, C. Chabrol, F. Schuster, C. Bernard, R. Madar, Surface and Coatings Technology 115 (1999) 103-110).

DISCLOSURE OF THE INVENTION

The invention is based on the task of achieving significantly improved friction wear resistance and oxidation resistance in the case of hard-material-coated bodies having a one-layer or multi-layer layer system that contains at least one $Ti_{1-x}Al_xN$ hard material layer.

This task is accomplished with the characteristics of the claims. The hard-material-coated bodies according to the invention are characterized in that they are coated with at least one $Ti_{1-x}Al_xN$ hard material layer produced by means of CVD, without plasma stimulation, which layer is present as a monophase layer in the cubic NaCl structure, with a stoichiometry coefficient x>0.75 up to x=0.93, and a lattice constant $a_{fcc}$ between 0.412 nm and 0.405 nm, or that is a multiphase $Ti_{1-x}Al_xN$ hard material layer whose main phase consists of $Ti_{1-x}Al_xN$ having a cubic NaCl structure, with a stoichiometry coefficient x>0.75 up to x=0.93, and a lattice constant $a_{fcc}$ between 0.412 nm and 0.405 nm, whereby $Ti_{1-x}Al_xN$ in the wurtzite structure and/or $TiN_x$ in the NaCl structure are contained as an additional phase. A further characteristic of this $Ti_{1-x}Al_xN$ hard material layer consists in the fact that its chlorine content lies in the range between only 0.05 and 0.9 at.-%. It is advantageous if the chlorine content of the $Ti_{1-x}Al_xN$ hard material layer(s) lies in the range of only 0.1 to 0.5 at.-%, and the oxygen content lies in the range of 0.1 to 5 at.-%.

The hardness value of the $Ti_{1-x}Al_xN$ hard material layer(s) lies in the range of 2500 HV to 3800 HV.

According to the invention, up to 30 mass-% amorphous layer components can be contained in the $Ti_{1-x}Al_xN$ hard material layer(s).

The layer that is present on the bodies, according to the invention, with its great hardness between 2500 HV to 3800 HV, and with a clearly improved oxidation resistance as compared with the state of the art, which is achieved by means of the high AlN proportion in the cubic $Ti_{1-x}Al_xN$ phase, has a combination of hardness and oxidation resistance that has not been achieved until now, which results in very good friction-wear resistance, particularly at high temperatures.

For the production of the bodies, the invention includes a method that is characterized in that the bodies are coated in a reactor, at temperatures in the range of 700° C. to 900° C., by means of CVD, without plasma stimulation, whereby titanium halogenides, aluminum halogenides, and reactive nitrogen compounds are used as precursors, which are mixed at elevated temperature.

According to the invention, $NH_3$ and/or $N_2H_4$ can be used as reactive nitrogen compounds.

It is advantageous if the precursors are mixed in the reactor, directly ahead of the deposition zone.

Mixing of the precursors is carried out, according to the invention, at temperatures in the range of 150° C. to 900° C. The coating process is advantageously carried out at pressures in the range of $10^2$ Pa to $10^5$ Pa.

Using the method according to the invention, it is possible to produce $Ti_{1-x}Al_xN$ layers having the NaCl structure by means of a comparatively simple thermal CVD process, at temperatures between 700° C. to 900° C., and pressures between $10^2$ Pa and $10^5$ Pa. Both the $Ti_{1-x}Al_xN$ layer compositions that were previously known, with x<0.75, and the new types of compositions, with x>0.75, which cannot be produced with any other method, can be obtained using the method. The method allows homogeneous coating even of complicated component geometries.

EMBODIMENTS OF THE INVENTION

In the following, the invention will be explained in greater detail using exemplary embodiments.

Example 1

A $Ti_{1-x}Al_xN$ layer is deposited onto WC/Co hard metal cutting inserts, by means of the thermal CVD method according to the invention. For this purpose, a gas mixture of 20 ml/min $AlCl_3$, 3.5 ml/min $TiCl_4$, 1400 ml/min $H_2$, 400 ml/min argon is introduced into a hot-wall CVD reactor having an inside diameter of 75 mm, at a temperature of 800° C. and a pressure of 1 kPa.

A mixture of 100 ml/min $NH_3$ and 200 ml/min $N_2$ is passed into the reactor by way of a second gas feed. Mixing of the two gas streams takes place at a distance of 10 cm ahead of the substrate carrier. After a coating time of 30 minutes, a gray-black layer having a thickness of 6 μm is obtained.

Only the cubic $Ti_{1-x}Al_xN$ phase is found by means of the X-ray thin-layer analysis carried out with sweeping incidence (see X-ray diffractogram, FIG. 1).

The lattice constant that is determined amounts to $a_{fcc}$=0.4085 nm. The atom ratio Ti:Al determined by means of WDX amounts to 0.107. The contents of chlorine and oxygen, which were also determined, amount to 0.1 at.-% for Cl and 2.0 at.-% for O.

Calculation of the stoichiometric coefficient yields x=0.90. A hardness of the layer of 3070 HV[0.05] is measured by means of a Vickers indenter. The $Ti_{1-x}Al_xN$ layer is oxidation resistant in air up to 1000° C.

Example 2

First, a titanium nitride layer having a thickness of 1 μm is applied to cutting inserts made of $Si_3N_4$ cutting ceramic, by means of a known standard CVD process, at 950° C. Afterwards, a gray-black layer is deposited with the CVD method according to the invention, using the gas mixture described in Example 1, a pressure of 1 kPa, and a temperature of 850° C.

Figure 2:
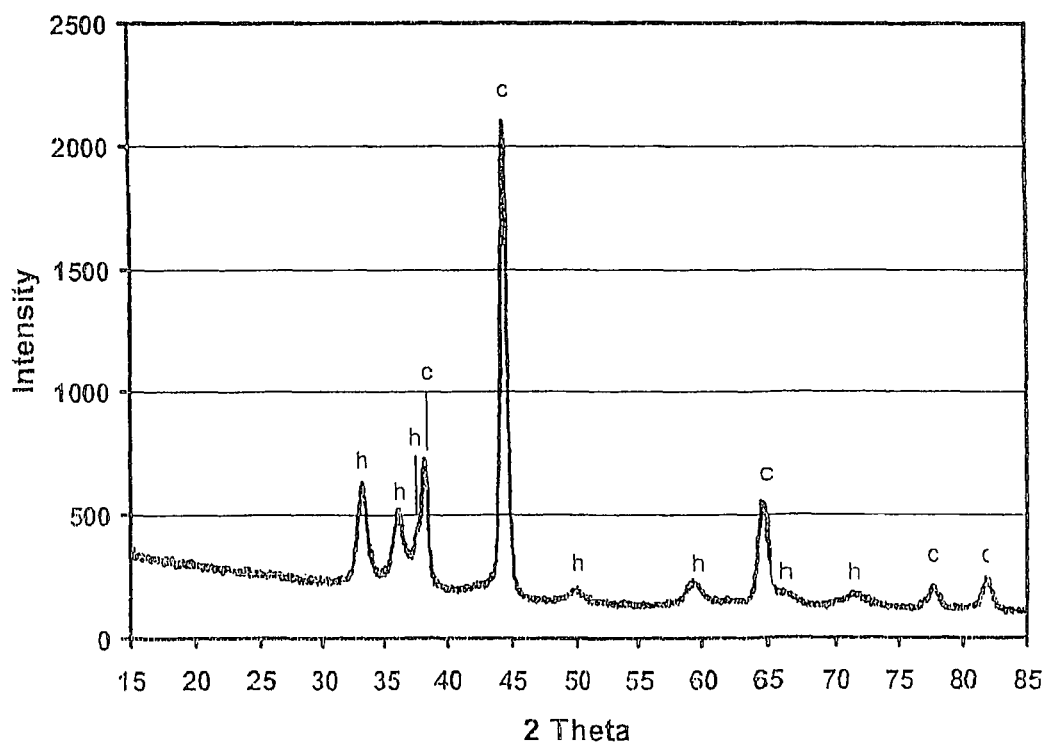

X-ray thin-layer analysis shows that here, a heterogeneous mixture of $Ti_{1-x}Al_xN$, having the NaCl structure and AlN having the wurtzite structure is present. In the X-ray diffractogram of FIG. 2 that was determined, the reflexes of the cubic $Ti_{1-x}Al_xN$ are indicated with c, and those of the hexagonal AlN (wurtzite structure) are indicated with h. The proportion of the cubic $Ti_{1-x}Al_xN$ in the layer predominates.

The lattice constant of the cubic phase that is determined amounts to $a_{fcc}$=0.4075 nm. The second, hexagonal AlN phase has lattice constants of a=0.3107 nm, and c=0.4956 nm. The hardness of the layer, determined by means of a Vickers indenter, amounts to 3150 HV[0.01]. The biphase $Ti_{1-x}Al_xN$ layer is oxidation-resistant in air up to 1050° C.

The invention claimed is:

1. Hard-material-coated bodies having a single-layer or multi-layer layer system that contains at least one $Ti_{1-x}Al_xN$ hard material layer produced by means of CVD without plasma stimulation, wherein the $Ti_{1-x}Al_xN$ hard material layer is present as a monophase layer in the cubic NaCl structure, with a stoichiometry coefficient x>0.75 up to x=0.93, and a lattice constant afcc between 0.412 nm and 0.405 nm, or wherein the $Ti_{1-x}Al_xN$ hard material layer is a multiphase layer whose main phase consists of $Ti_{1-x}Al_xN$ having a cubic NaCl structure, with a stoichiometry coefficient x>0.75 up to x=0.93, and a lattice constant afcc between 0.412 nm and 0.405 nm, and $Ti_{1-x}Al_xN$ in the wurtzite structure and/or TiNx in the NaCl structure are contained as an additional phase, and wherein the chlorine content of the $Ti_{1-x}Al_xN$ hard material layer lies in the range between 0.05 and 0.9 at.-%.

2. Hard-material-coated bodies according to claim 1, wherein the chlorine content of the $Ti_{1-x}Al_xN$ hard material layer(s) lies in the range of 0.1 to 0.5 at.-%.

3. Hard-material-coated bodies according to claim 1, wherein the oxygen content of the $Ti_{1-x}Al_xN$ hard material layer(s) lies in the range of 0.1 to 5 at.-%.

4. Hard-material-coated bodies according to claim 1, wherein the hardness value of the $Ti_{1-x}Al_xN$ hard material layer(s) lies in the range of 2500 HV to 3800 HV.

5. Hard-material-coated bodies according to claim 1, wherein the $Ti_{1-x}Al_xN$ hard material layer(s) contain(s) 0 to 30 mass-% amorphous layer components.

6. Method for the production of hard-material-coated bodies having a single-layer or multi-layer layer system that contains at least one $Ti_{1-x}Al_xN$ hard material layer, wherein the bodies are coated in a reactor, at temperatures in the range of 700° C. to 900° C., by means of CVD, without plasma stimulation, whereby titanium halogenides, aluminum halogenides, and reactive nitrogen compounds are used as precursors, which are mixed at elevated temperature.

7. Method according to claim 6, wherein $NH_3$ and/or $N_2H_4$ are used as reactive nitrogen compounds.

8. Method according to claim 6, wherein the precursors are mixed in the reactor, directly ahead of the deposition zone.

9. Method according to claim 6, wherein mixing of the precursors is carried out at temperatures in the range of 150° C. to 900° C.

10. Method according to claim 6, wherein the coating process is carried out at pressures in the range of $10^2$ Pa to $10^5$ Pa.

* * * * *